(12) United States Patent
Yoshikawa et al.

(10) Patent No.: US 10,144,040 B2
(45) Date of Patent: Dec. 4, 2018

(54) PLASMA PROCESSING METHOD AND PLASMA PROCESSING APPARATUS

(71) Applicant: Tokyo Electron Limited, Tokyo (JP)

(72) Inventors: Wataru Yoshikawa, Sendai (JP); Naoki Matsumoto, Sendai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 681 days.

(21) Appl. No.: 14/356,719

(22) PCT Filed: Oct. 17, 2012

(86) PCT No.: PCT/JP2012/076824
§ 371 (c)(1),
(2) Date: May 7, 2014

(87) PCT Pub. No.: WO2013/069424
PCT Pub. Date: May 16, 2013

(65) Prior Publication Data
US 2014/0299152 A1    Oct. 9, 2014

(30) Foreign Application Priority Data

Nov. 8, 2011 (JP) ................................. 2011-244679

(51) Int. Cl.
*B08B 7/00* (2006.01)
*C23C 16/511* (2006.01)
*H01J 37/32* (2006.01)

(52) U.S. Cl.
CPC .......... *B08B 7/0035* (2013.01); *C23C 16/511* (2013.01); *H01J 37/3222* (2013.01); *H01J 37/32192* (2013.01); *H01J 37/32862* (2013.01)

(58) Field of Classification Search
CPC ................. B08B 7/0035; C23C 16/511; H01J 37/32192; H01J 37/3222; H01J 37/32862
See application file for complete search history.

(56) References Cited

U.S. PATENT DOCUMENTS

2004/0200498 A1* 10/2004 Wang ................... B08B 7/0035
134/1.1
2004/0231800 A1* 11/2004 Singh .................. C23C 16/4404
156/345.48

(Continued)

FOREIGN PATENT DOCUMENTS

JP       2010-021243 A     1/2010
JP       2010021243 A  *  1/2010

(Continued)

OTHER PUBLICATIONS

International Search Report issued in Application No. PCT/JP2012/076824 dated Jan. 15, 2013.

*Primary Examiner* — Douglas Lee
(74) *Attorney, Agent, or Firm* — Pearne & Gordon LLP

(57) ABSTRACT

A plasma processing apparatus includes a slot plate of an antenna and the slot plate has slots arranged in a circumferential direction thereof with respect to an axis line. A microwave is introduced into a processing space from the antenna via a dielectric window, and a through hole is formed in the dielectric window along the axis line. A plasma processing method performed in the plasma processing apparatus includes performing a first cleaning process by radiating the microwave from the antenna and supplying a cleaning gas from a cleaning gas supply system; and performing a second cleaning process by radiating the microwave from the antenna and supplying the cleaning gas from the cleaning gas supply system. A first pressure of the processing space in the performing of the first cleaning process is set to be lower than a second pressure thereof in the performing of the second cleaning process.

8 Claims, 7 Drawing Sheets

(56) References Cited

U.S. PATENT DOCUMENTS

| | | | | |
|---|---|---|---|---|
| 2006/0226119 A1* | 10/2006 | Kannan | ................ | B08B 7/0035 |
| | | | | 216/67 |
| 2007/0163617 A1* | 7/2007 | Ozaki | ................... | B08B 7/0035 |
| | | | | 134/1.1 |
| 2011/0048642 A1* | 3/2011 | Mihara | ............. | H01J 37/32192 |
| | | | | 156/345.34 |
| 2013/0093321 A1* | 4/2013 | Yoshikawa | ....... | H01J 37/32192 |
| | | | | 315/39 |

FOREIGN PATENT DOCUMENTS

| | | | | |
|---|---|---|---|---|
| JP | WO 2011125524 A1 * | 10/2011 | ........ | H01J 37/32192 |
| WO | 2011/125524 A1 | 10/2011 | | |
| WO | WO-2011125524 A1 * | 10/2011 | ........ | H01J 37/32192 |

* cited by examiner

PLASMA PROCESSING METHOD AND PLASMA PROCESSING APPARATUS

CROSS-REFERENCE TO RELATED APPLICATION

This Application is a U.S. national phase application under 35 U.S.C. § 371 of PCT Application No. PCT/JP2012/076824 filed on Oct. 17, 2012, which claims the benefit of Japanese Patent Application No. 2011-244679 filed on Nov. 8, 2011, the entire disclosures of which are incorporated herein by reference.

TECHNICAL FIELD

The embodiments described herein pertain generally to a plasma processing method and a plasma processing apparatus.

BACKGROUND ART

Patent Document 1 describes a plasma processing apparatus. The plasma processing apparatus described in Patent Document 1 includes a processing vessel, an antenna and a dielectric window. The processing vessel has a processing space formed therein, and the antenna is configured to radiate a microwave for plasma excitation. The antenna includes a slot plate having a multiple number of slots arranged in a circumferential direction with respect to an axis line. The dielectric window is provided between the processing space and the antenna. A through hole configured to supply a processing gas into the processing space is formed in the dielectric window. The through hole is extended along the axis line and has a tapered shape of which diameter decreases toward the processing space.

In this plasma processing apparatus, a plasma process using a carbon-containing processing gas such as a CF-based processing gas may be performed.

Patent Document 1: Japanese Patent Laid-open Publication No. 2010-021243

DISCLOSURE OF THE INVENTION

Problems to be Solved by the Invention

In the above-described plasma processing apparatus, a deposit based on a component contained in the processing gas may be formed on, for example, a wall surface exposed to the processing gas. To remove the deposit, a cleaning process of the inside of the plasma processing apparatus is performed.

In this technical filed, there has been a demand for a cleaning process of further removing the deposit within the plasma processing apparatus.

Means for Solving the Problems

In one example embodiment, a plasma processing method is performed in a plasma processing apparatus. Further, the plasma processing apparatus configured to perform the plasma processing method includes a processing vessel, a microwave generator, an antenna, a dielectric window, and a cleaning gas supply system. The processing vessel has a processing space formed therein. The antenna is configured to radiate a microwave for plasma excitation based on a microwave generated by the microwave generator. Further, the antenna includes a slot plate having multiple slots arranged in a circumferential direction thereof with respect to an axis line. The dielectric window is provided between the processing space and the antenna. The dielectric window has a through hole through which a gas is supplied into the processing space, and the through hole is formed in the dielectric window along the axis line. Moreover, the through hole includes an opening at a side of the antenna and an opening at a side of the processing space. Here, an area of a portion of the through hole between the opening at the side of the antenna and the opening at the side of the processing space is set to be smaller than an area of another portion of the through hole between the portion and the opening at the side of the antenna. The cleaning gas supply system is configured to supply a cleaning gas containing an oxygen gas into the through hole. Furthermore, the plasma processing method includes performing a first cleaning process by radiating the microwave from the antenna and supplying the cleaning gas from the cleaning gas supply system; and performing a second cleaning process by radiating the microwave from the antenna and supplying the cleaning gas from the cleaning gas supply system. Here, a first pressure of the processing space in the performing of the first cleaning process is set to be lower than a second pressure of the processing space in the performing of the second cleaning process.

If the cleaning gas is supplied such that the pressure of the processing space is set to be the relatively higher second pressure, a relatively greater amount of cleaning gas molecules may exist within the processing space. As a result, microwave energy applied from the antenna may be mainly consumed by the cleaning gas molecules that exist within the processing space. Accordingly, when the pressure of the processing gas is set to be the second pressure, the wall surface of the processing vessel forming the processing space may be mainly cleaned. Meanwhile, when the cleaning gas is supplied such that the pressure of the processing space is set to be the relatively lower first pressure, an amount of the cleaning gas molecules in the through hole of the dielectric window becomes greater than that of the cleaning gas molecules in the processing space. As a result, at the first pressure, the microwave energy may be consumed in a relatively greater amount in the through hole of the dielectric window, so that plasma can be generated efficiently in the through hole. Thus, at the first pressure, it may be possible to efficiently clean a surface of a member facing the through hole, e.g., a wall surface of the dielectric window forming the through hole. In this way, since the surface of the member facing the through hole as well as the wall surface of the processing vessel is cleaned, it is possible to further reduce a deposit by performing this plasma processing method.

In the example embodiment, the first pressure may be equal to or less than about 10 mTorr. By setting the first pressure to have such a range, it is possible to generate plasma in the through hole of the dielectric window more efficiently.

In the example embodiment, an argon gas may be additionally supplied into the through hole in the performing of the first cleaning process. By supplying the argon gas into the through hole, it is possible to generate the plasma within the through hole more efficiently.

In the example embodiment, the performing of the first cleaning process may be carried out before the performing of the second cleaning process. By performing the first cleaning process of the surface of the member facing the through hole, it is possible to clean the processing space after a reaction product between the deposit formed on the surface of the member facing the through hole and the cleaning gas is discharged out into the processing space. Accordingly, the deposit within the plasma processing apparatus can be further reduced.

In the example embodiment, the plasma processing apparatus may further include a stage provided to face the dielectric window in an extension direction of the axis line (hereinafter, simply referred to as "axis line direction"); a gas supply unit configured to supply a gas from surroundings of the axis line into a space between the stage and the dielectric window; and another cleaning gas supply system configured to supply a cleaning gas containing an oxygen gas into the gas supply unit. Further, the cleaning gas from the gas supply unit may be additionally supplied into the processing space in the performing of the first cleaning process. According to this example embodiment, the microwave energy which is not consumed in the through hole of the dielectric window can be consumed by the cleaning gas supplied into the processing space from the another cleaning gas supply system via the gas supply unit. Accordingly, it may be possible to suppress the wall surface of the processing vessel forming the processing space or on a member provided within the processing space from being damaged by the microwave energy yet to be consumed in the through hole.

In another example embodiment, a plasma processing apparatus includes a processing vessel, a microwave generator, an antenna, a dielectric window, a cleaning gas supply system, and a controller. The processing vessel has a processing space formed therein. The antenna is configured to radiate a microwave for plasma excitation based on a microwave generated by the microwave generator. Further, the antenna includes a slot plate having multiple slots arranged in a circumferential direction thereof with respect to an axis line. The dielectric window is provided between the processing space and the antenna. The dielectric window has a through hole through which a gas is supplied into the processing space, and the through hole is formed in the dielectric window along the axis line. The through hole includes an opening at a side of the antenna and an opening at a side of the processing space. Here, an area of a portion of the through hole between the opening at the side of the antenna and the opening at the side of the processing space is set to be smaller than an area of another portion of the through hole between the portion and the opening at the side of the antenna. The cleaning gas supply system is configured to supply a cleaning gas containing an oxygen gas into the through hole. Furthermore, the controller is operated in a first mode to supply the cleaning gas from the cleaning gas supply system such that a pressure of the processing space is set to be a first pressure while the microwave generator generates the microwave. Moreover, the controller is operated in a second mode to supply the cleaning gas from the cleaning gas supply system such that the pressure of the processing space is set to be a second pressure higher than the first pressure while the microwave generator generates the microwave.

In this plasma processing apparatus, when the cleaning gas is supplied such that the pressure of the processing space is set to be the relatively higher second pressure, i.e., when the controller is operated in the second mode, the wall surface of the processing vessel forming the processing space may be mainly cleaned. Meanwhile, when the cleaning gas is supplied such that the pressure of the processing space is set to be the relatively lower first pressure, i.e., when the controller is operated in the first mode, plasma can be generated in the through hole of the dielectric window efficiently. Thus, when the controller is operated in the first mode, it may be possible to efficiently clean a surface of a member facing the through hole. In accordance with the plasma processing apparatus, since the surface of the member facing the through hole as well as the wall surface of the processing vessel is cleaned, it is possible to further reduce a deposit. As a consequence, when the controller is operated in the first mode, it is possible to efficiently clean the surface of the member facing the through hole. Thus, by using this plasma processing apparatus, it is possible to clean the surface of the member facing the through hole as well as the wall surface of the processing vessel, so that the deposit can be further reduced.

In the example embodiment, the first pressure may be equal to or less than about 10 mTorr. By setting the first pressure to have such a range, it is possible to generate plasma in the through hole of the dielectric window more efficiently.

In the example embodiment, the plasma processing apparatus may further include a gas supply system configured to supply an argon gas into the through hole. Since the argon gas can be supplied into the through hole from the gas supply system, it is possible to generate the plasma within the through hole more efficiently.

In the example embodiment, the controller may be operated in the second mode after operated in the first mode. By performing the cleaning process in the through hole of the dielectric window first, it is possible to clean the processing space after a reaction product between the deposit formed on the surface of the member facing the through hole and the cleaning gas is discharged out into the processing space. Accordingly, the deposit within the plasma processing apparatus can be further reduced.

In the example embodiment, the plasma processing apparatus may further include a stage provided to face the dielectric window in the axis line direction; a gas supply unit configured to supply a gas from the surroundings of the axis line into a space between the stage and the dielectric window; and another cleaning gas supply system configured to supply a cleaning gas containing an oxygen gas into the gas supply unit. Further, the controller may be configured to supply, in the first mode, the cleaning gas from the another gas supply system. According to this example embodiment, the microwave energy which is not consumed in the through hole of the dielectric window can be consumed by the cleaning gas supplied into the processing space from the another cleaning gas supply system. Accordingly, it may be possible to suppress the wall surface of the processing vessel forming the processing space or on a member provided within the processing space from being damaged by the microwave energy yet to be consumed in the through hole.

Effect of the Invention

In accordance with the example embodiments, it is possible to provide a plasma processing method and a plasma processing apparatus capable of further reducing a deposit.

MODE FOR CARRYING OUT THE INVENTION

Figure 1:
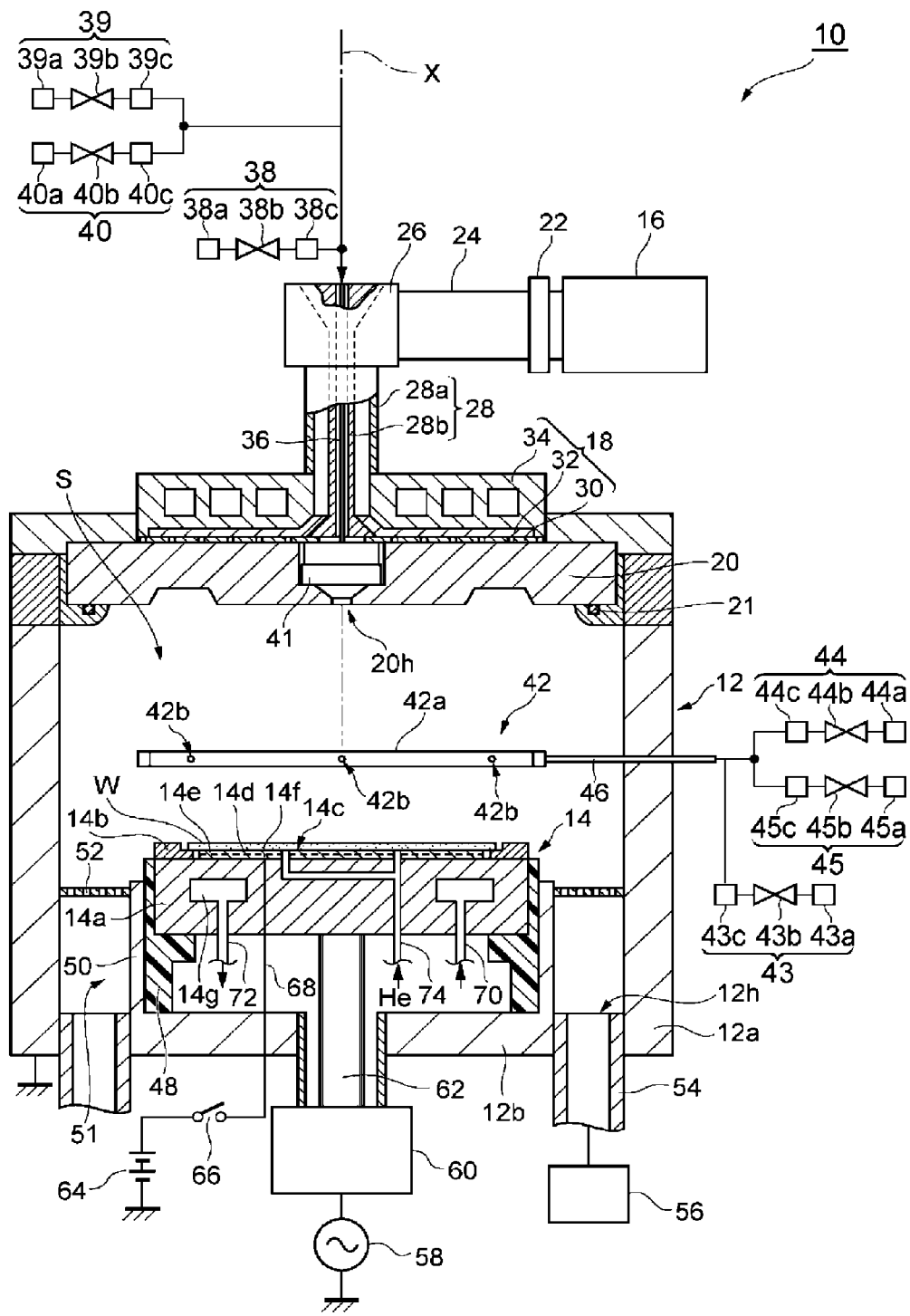
FIG. 1 is a diagram schematically illustrating a plasma processing apparatus in accordance with an example embodiment.

In the following description, example embodiments will be discussed in detail, and reference is made to the accompanying drawings, which form a part of the description. In the various drawings, similar or same parts will be assigned same reference numerals.

FIG. 1 is a diagram schematically illustrating a plasma processing apparatus 10 in accordance with an example embodiment. The plasma processing apparatus 10 shown in FIG. 1 includes a processing vessel 12, a stage 14, a microwave generator 16, an antenna 18 and a dielectric window 20.

The processing vessel 12 has therein a processing space S in which a plasma process is performed on a processing target substrate W. The processing vessel 12 includes a sidewall 12a and a bottom 12b. The sidewall 12a has a substantially cylindrical shape extended in a direction of an axis line X (i.e., an extension direction of the axis line X). The bottom 12b is provided at a lower end of the sidewall 12a. A gas exhaust hole 12h for gas exhaust is formed at the bottom 12b. An upper end of the sidewall 12a is opened.

The opening at the upper end of the sidewall 12a is closed by the dielectric window 20. An O-ring 21 may be provided between the dielectric window 20 and the upper end of the sidewall 12a. The O-ring 21 allows the processing vessel 12 to be hermetically sealed more securely.

The microwave generator 16 is configured to generate a microwave of, e.g., about 2.45 GHz. In the present example embodiment, the plasma processing apparatus 10 may further include a tuner 22, a waveguide 24, a mode converter 26 and a coaxial waveguide 28.

The microwave generator 16 is connected to the waveguide 24 via the tuner 22. The waveguide 24 has, for example, a rectangular shape. The waveguide 24 is connected to the mode converter 26, and the mode converter 26 is connected to an upper end of the coaxial waveguide 28.

The coaxial waveguide 28 is extended along the axis line X. The coaxial waveguide 28 includes an outer conductor 28a and an inner conductor 28b. The outer conductor 28a has a substantially cylindrical shape extended in the direction of the axis line X. The inner conductor 28b is provided within the outer conductor 28a. The inner conductor 28b has a substantially cylindrical shape extended along the axis line X.

The microwave generated by the microwave generator 16 is propagated to the mode converter 26 via the tuner 22 and the waveguide 24. The mode converter 26 is configured to convert a mode of the microwave and then apply the mode-converted microwave to the coaxial waveguide 28. Then, the microwave from the coaxial waveguide 28 is supplied to the antenna 18.

The antenna 18 radiates a microwave for plasma excitation based on the microwave generated by the microwave generator 16. The antenna 18 may include a slot plate 30, a dielectric plate 32 and a cooling jacket 34.

Figure 2:
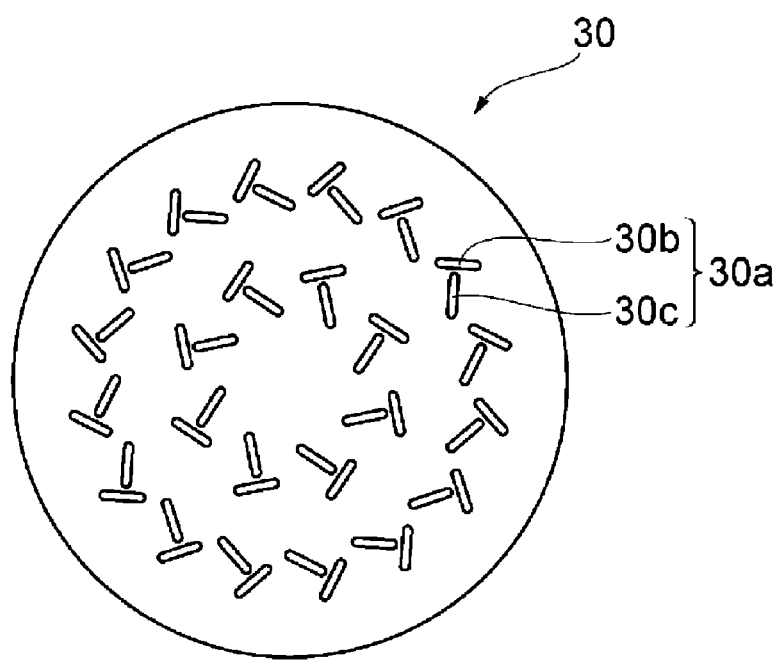
FIG. 2 is a plane view of a slot plate seen from a direction of an axis line X in accordance with the example embodiment.

The slot plate 30 has a multiple number of slots arranged in a circumferential direction with respect to the axis line X. FIG. 2 is a plane view of the slot plate seen from the direction of the axis line X in accordance with the example embodiment. In the present example embodiment, as illustrated in FIG. 2, the slot plate 30 may form a radial line slot antenna. The slot plate 30 is made of a conductive circular metal plate. The slot plate 30 has a multiple number of slot pairs 30a, and each of the slot pair 30a includes a slot 30b and a slot 30c. Further, the slot 30b and the slot 30c are extended in a direction where they are intersected with each other or in a direction where they are perpendicular to each other. The multiple number of slot pairs 30a are arranged at a regular distance therebetween in a radial direction and at a regular distance therebetween in the circumferential direction as well.

Referring back to FIG. 1, the dielectric plate 32 is provided between the slot plate 30 and a bottom surface of the cooling jacket 34. The dielectric plate 32 may be made of, but not limited to, quartz and has a substantially circular plate shape. Surfaces of the cooling jacket 34 may have conductivity. The cooling jacket 34 is configured to cool the dielectric plate 32 and the slot plate 30. To this end, a coolant path is formed within the cooling jacket 34. A lower end of the outer conductor 28a is electrically connected to a top surface of the cooling jacket 34, while a lower end of the inner conductor 28b is electrically connected to the slot plate 30 through holes formed in central portions of the cooling jacket 34 and the dielectric plate 32.

A microwave from the coaxial waveguide 28 is propagated to the dielectric plate 32 and introduced into the processing space S through the slots of the slot plate 30 and the dielectric window 20. The dielectric window 20 has a substantially circular plate shape and is made of, but not limited to, quartz. The dielectric window 20 is provided between the processing space S and the antenna 18. In the present example embodiment, the dielectric window 20 is provided directly under the antenna 18 in the direction of the axis line X.

In the present example embodiment, a pipe 36 is inserted through an inner hole of the inner conductor 28b of the coaxial waveguide 28. The pipe 36 is extended along the axis line X and may be connected to a gas supply system 38, a gas supply system 39 and a gas supply system 40.

The gas supply system 38 is configured to supply a processing gas for processing a processing target substrate W into the pipe 36. The processing gas supplied from the gas supply system 38 contains carbon. In the present example embodiment, the processing gas serves as an etching gas, e.g., a $CF_4$ gas or a $CH_2F_2$ gas. The gas supply system 38 may include a gas source 38a, a valve 38b and a flow rate controller 38c. The gas source 38a is a source of the processing gas. The valve 38b is configured to switch a start and a stop of a supply of the processing gas from the gas source 38a. The flow rate controller 38c is implemented by, e.g., a mass flow controller and is configured to adjust a flow rate of the processing gas from the gas source 38a.

The gas supply system 39 is configured to supply an oxygen gas ($O_2$ gas) into the pipe 36. The oxygen gas supplied from the gas supply system 39 serves as a cleaning gas. The gas supply system 39 may include a gas source 39a, a valve 396b and a flow rate controller 39c. The gas source 39a is a source of the oxygen gas. The valve 39b is configured to switch a start and a stop of a supply of the oxygen gas from the gas source 39a. The flow rate controller 39c is implemented by, e.g., a mass flow controller and is configured to adjust a flow rate of the gas from the gas source 39a.

The gas supply system 40 is configured to supply an argon gas into the pipe 36. In the present example embodiment, the argon gas is supplied from the gas supply system 40 along with the cleaning gas from the gas supply system 39. The gas supply system 40 may include a gas source 40a, a valve 40b and a flow rate controller 40c. The gas source 40a is a source of the argon gas. The valve 40b is configured to switch a start and a stop of a supply of the argon gas from the gas source 40a. The flow rate controller 40c is implemented by, e.g., a mass flow controller and is configured to adjust a flow rate of the argon gas from the gas source 40a.

In the present example embodiment, the plasma processing apparatus 10 may further include an injector 41. The injector 41 is configured to supply the gas from the pipe 36 into a through hole 20h formed at the dielectric window 20. The gas supplied to the through hole 20h of the dielectric window 20 is then introduced into the processing space S. In the following description, a gas supply path formed by the pipe 36, the injector 41 and the through hole 20h may be referred to as "central gas inlet unit."

In the present example embodiment, the plasma processing apparatus 10 may further include a gas supply unit 42. The gas supply unit 42 is configured to supply a gas into the processing space S from the surroundings of the axis line X into a space between the stage 14 and the dielectric window 20. In the following description, the gas supply unit 42 may also be referred to as "peripheral gas inlet unit 42." The gas supply unit 42 may include a pipe 42a. The pipe 42a is annularly extended about the axis line X between the dielectric window 20 and the stage 14. Further, the pipe 42a has a multiple number of gas supply holes 42b. The gas supply holes 42b are annularly arranged and opened toward the axis line X. Through the gas supply holes 42b, the gas introduced into the pipe 42a is supplied toward the axis line X. The gas supply unit 42 is connected to a gas supply system 43, a gas supply system 44 and a gas supply system 45 via a pipe 46.

The gas supply system 43 is configured to supply a processing gas for processing the processing target substrate W into the gas supply unit 42. The processing gas supplied from the gas supply system 43 also contains carbon, like the processing gas supplied from the gas supply system 38. In this example embodiment, this processing gas serves as an etching gas, e.g., $CF_4$ or $CH_2F_2$. The gas supply system 43 may include a gas source 43a, a valve 43b and a flow rate controller 43c. The gas source 43a is a source of the processing gas. The valve 43b is configured to switch a start and a stop of the supply of the processing gas from the gas source 43a. The flow rate controller 43c may be implemented by, for example, a mass flow controller and is configured to adjust a flow rate of the processing gas supplied from the gas source 43a.

The gas supply system 44 is configured to supply an oxygen gas ($O_2$ gas) into the gas supply unit 42. The gas supplied from the gas supply system 44 serves as a cleaning gas. The gas supply system 44 may include a gas source 44a, a valve 44b and a flow rate controller 44c. The gas source 44a is a source of the oxygen gas. The valve 44b is configured to switch a start and a stop of a supply of the gas from the gas source 44a. The flow rate controller 44c may be implemented by, for example, a mass flow controller and is configured to adjust a flow rate of the gas from the gas source 44a.

The gas supply system 45 is configured to supply an argon gas into the gas supply unit 42. In the present example embodiment, the argon gas from the gas supply system 45 is supplied along with the cleaning gas from the gas supply system 44. The gas supply system 45 may include a gas source 45a, a valve 45b and a flow rate controller 45c. The gas source 45a is a source of the argon gas. The valve 45b is configured to switch a start and a stop of a supply of the argon gas from the gas source 45a. The flow rate controller 45c may be implemented by, for example, a mass flow controller and is configured to adjust a flow rate of the argon gas from the gas source 45a.

The stage 14 is provided to face the dielectric window 20 in the direction of the axis line X. The stage 14 is disposed such that the processing space S is formed between the dielectric window 20 and the stage 14. A processing target substrate is mounted on the stage 14. In the present example embodiment, the stage 14 may include a table 14a, a focus ring 14b and an electrostatic chuck 14c.

The table 14a is supported by a cylindrical supporting member 48. The cylindrical supporting member 48 is made of an insulating material and vertically extended upward from the bottom 12b. Further, a conductive cylindrical supporting member 50 is provided to surround the cylindrical supporting member 48. The cylindrical supporting member 50 is vertically extended upward from the bottom 12b of the processing vessel 12 along the periphery of the cylindrical supporting member 48. An annular gas exhaust path 51 is formed between the cylindrical supporting member 50 and the sidewall 12a.

An annular baffle plate 52 having a multiple number of through holes is provided at an upper portion of the gas exhaust path 51. A gas exhaust device 56 is connected to a lower portion of the gas exhaust hole 12h via a gas exhaust line 54. The gas exhaust device 56 includes a vacuum pump such as a turbo molecular pump. The gas exhaust device 56 is configured to depressurize the processing space S within the processing vessel 12 to a required vacuum degree.

The table 14a also serves as a high frequency electrode. A high frequency power supply 58 for RF bias is electrically connected to the table 14a via a matching unit 60 and a power supply rod 62. The high frequency power supply 58 is configured to apply a high frequency power of a certain frequency, e.g., about 13.56 MHz, which is suitable for controlling the energy of ions attracted to the processing target substrate W, at a preset power level. The matching unit 60 accommodates therein a matching device configured to match impedance at the side of the high frequency power supply 58 with load impedance such as an electrode, plasma or the processing vessel 12. The matching device may include a blocking capacitor for self-bias generation.

The electrostatic chuck 14c is provided on a top surface of the table 14a. The electrostatic chuck 14c is configured to hold thereon the processing target substrate W by an electrostatic attracting force. A focus ring 14b is annularly provided at an outside of the electrostatic chuck 14c in a radical direction to surround the processing target substrate W. The electrostatic chuck 14c includes an electrode 14d, an insulating film 14e and an insulating film 14f. The electrode 14d is made of a conductive film and is provided between the insulating films 14e and 14f. A high-voltage DC power supply 64 is electrically connected to the electrode 14d via a switch 66 and a coated line 68. The electrostatic chuck 14c is capable of attracting and holding the processing target substrate W by a Coulomb force generated by applying a DC voltage from the DC power supply 64.

An annular coolant path 14g extended in the circumferential direction is formed within the table 14a. A coolant of a preset temperature, e.g., cooling water is supplied into and circulated through the coolant path 14g from a chiller unit (not shown) via lines 70 and 72. Based on the temperature of the coolant, a heat transfer gas for the electrostatic chuck 14c, e.g., a He gas is supplied to a gap between a top surface of the electrostatic chuck 14c and a rear surface of the processing target substrate W through a gas supply line 74.

Figure 3:
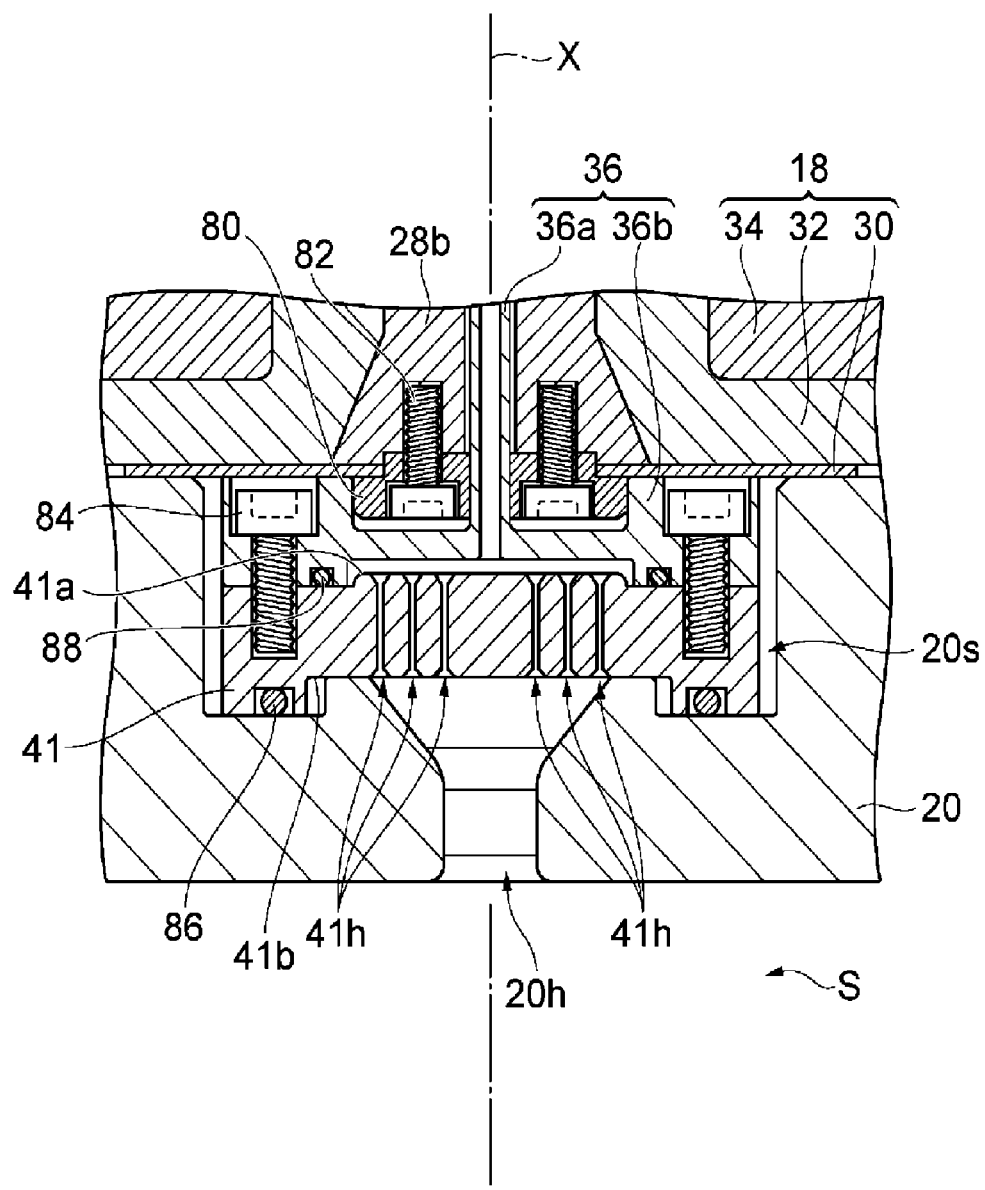
FIG. 3 is an enlarged cross sectional view illustrating an injector and a through hole of a dielectric window in accordance with the example embodiment.

Referring to FIG. 3, the injector 41 and the through hole 20h of the dielectric window 20 will be explained in further detail. FIG. 3 is an enlarged cross sectional view illustrating the injector and the through hole of the dielectric window in the present example embodiment.

As depicted in FIG. 3, an accommodation space 20s and the through hole 20h are formed in the dielectric window 20 in sequence from the top thereof along the axis line X. The through hole 20h allows the accommodation space 20s and the processing space S to communicate with each other. The through hole 20h is formed such that an area of a portion of the through hole 20h between an opening of the through hole 20h at the side of the antenna 18 and an opening thereof at the side of the processing space S is smaller than an area of another portion of the through hole 20h between that portion and the opening of the through hole 20h at the side of the antenna 18. Here, the term "area" implies an area of the through hole 20h on a plane orthogonal to the axis line X. In one example embodiment, as illustrated in FIG. 3, the through hole 20h may have a tapered shape such that a diameter thereof decreases downward along the axis line X.

The injector 41 and an end portion 36b of the pipe 36 are accommodated in the accommodation space 20s. The pipe 36 may be made of a conductive metal. The pipe 36 includes a main body 36a and the end portion 36b. The main body 36a has a cylindrical shape extended long the axis line X, and the end portion 36b has a substantially circular plate shape with an outer diameter larger than that of the main body 36a. The pipe 36 is provided with an inner hole for supplying the gas formed through the main body 36a and the end portion 36b. The main body 36a of the pipe 36 is inserted through the inner hole of the inner conductor 28b.

The inner conductor 28b is connected to the slot plate 30, as stated above. In the present example embodiment, the slot plate 30 has a through hole formed along the axis line X. An inner periphery portion of the slot plate 30 forming the through hole is supported by a lower end of the inner conductor 28b and a metallic member 80. The metallic member 80 is fastened to the lower end of the inner conductor 28b by screws 82. Further, a bottom surface of the slot plate 30 is in contact with a top surface of the end portion 36b of the pipe 36. In this configuration, the inner conductor 28b, the slot plate 30 and the pipe 36 are electrically connected to each other.

The injector 41 is accommodated in the accommodation space 20s to be located under the end portion 36b of the pipe 36. The injector 41 has conductivity and has a substantially circular plate shape. The injector 41 may be made of, but not limited to, aluminum or stainless steel.

The injector 41 has a first surface 41a at the side of the end portion 36b and a second surface 41b at the side of the through hole 20h. Further, the injector 41 is provided with a multiple number of through holes 41h extended from the first surface 41a to the second surface 41b. In the present example embodiment, an $Y_2O_3$ film may be formed on the second surface 41b. By way of non-limiting example, this $Y_2O_3$ film may be formed through a process of coating the second surface 41b with $Y_2O_3$ and then melting the coated film with an electron beam.

The injector 41 is fixed to the end portion 36b of the pipe 36 by screws 84 and electrically connected to the end portion 36b. Accordingly, the injector 41 may be set to be of the same electric potential as those of the inner conductor 28b, the slot plate 30 and the pipe 36. The injector 41 is set to be, e.g., grounded.

In the example embodiment, an O-ring 86 may be provided between the second surface 41b of the injector 41 and the dielectric window 20. The O-ring 86 may be annularly extended to surround openings of the multiple number of through holes 41h at the side of the through hole 20h, so that a space between the injector 41 and the dielectric window 20 is airtightly sealed. Further, an O-ring 88 may be provided between the first surface 41a and the end portion 36b of the pipe 36. The O-ring 88 may be annularly extended to surround openings of the multiple number of through holes 41h at the side of the end portion 36b, so that a space between the injector 41 and the end portion 36b of the pipe 36 is airtightly sealed.

In the plasma processing apparatus 10 having the above-described configuration, a gas is supplied into the processing space S along the axis line X through the pipe 36, the through holes 41h of the injector 41 and the through hole 20h of the dielectric window 20 in sequence. Further, a gas is also supplied toward the axis line X from the gas supply unit 42 under the through hole 20h. A microwave is introduced into at least one of the processing space S and the through hole 20h from the antenna 18 via the dielectric window 20. As a result, plasma is generated in the processing space S and/or in the through hole 20h. In this way, it is possible to generate plasma by using the plasma processing apparatus 10 without applying a magnetic field.

Figure 4:
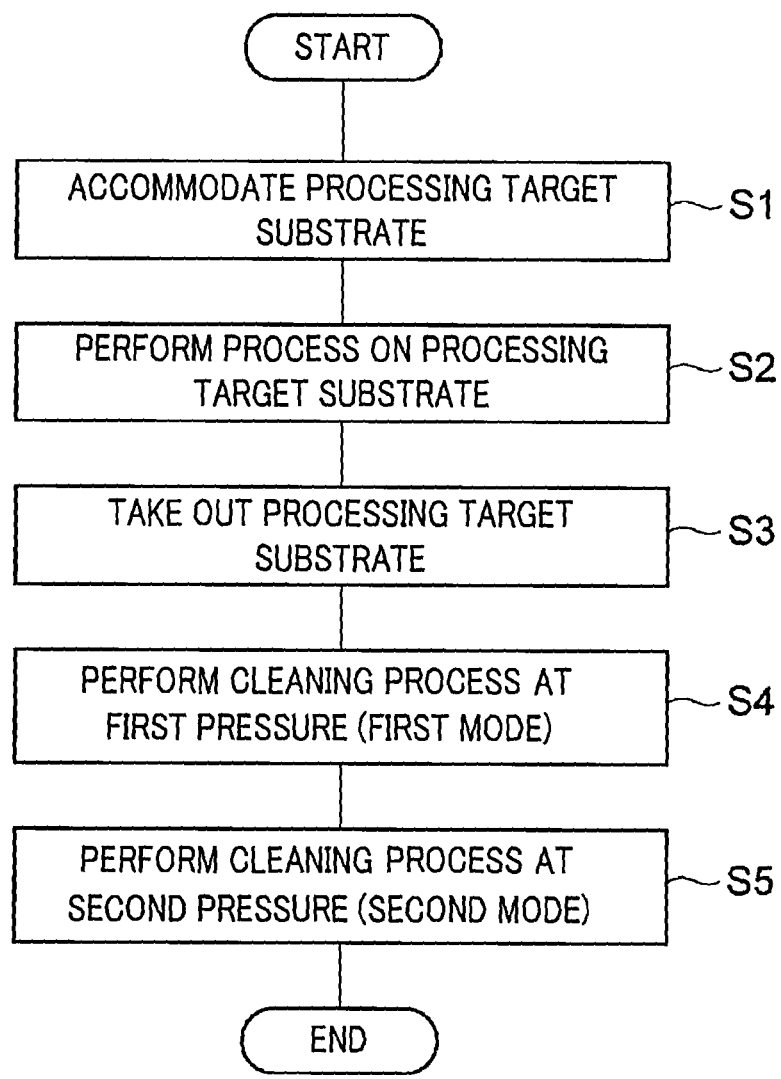
FIG. 4 is a flowchart for describing a plasma processing method in accordance with the example embodiment.

Now, the example embodiment of a plasma processing method performed by using the plasma processing apparatus 10 will be elaborated. FIG. 4 is a flowchart for describing a sequence of the plasma processing method in accordance with the example embodiment. In the plasma processing method shown in FIG. 4, a processing target substrate W is accommodated in the processing space S and mounted on the stage 14 (block S1).

Then, a process is performed on the processing target substrate W (block S2). In this process, a microwave is generated from the microwave generator 16, and a processing gas is supplied from the gas supply system 38. Further, a processing gas may also be supplied from gas supply system 43. At block S2, the microwave generator 16 is set to be in an operation mode to generate the microwave. Further, the valve 38b of the gas supply system 38 is opened, and the flow rate controller 38c is controlled to adjust a supply rate of the processing gas. Furthermore, the valve 43b of the gas supply system 43 is opened, and the flow rate controller 43c is controlled to adjust a supply rate of the processing gas. The processing gas supplied from the gas supply systems 38 and 43 may contain carbon as stated above. By way of example, the processing gas may be an etching gas such as $CF_4$ or $CH_2F_2$ as stated above. As a result of using the carbon-containing processing gas, a deposit may be formed on an inner wall surface of the processing vessel 12 or on a surface of a member facing the through hole 20h. Here, the surface of the member facing the through hole 20h may include, by way of non-limiting example, a wall surface of the dielectric window 20 forming the through hole 20h or the second surface 41b of the injector 41 facing the through hole 20h.

In the present example embodiment, at block S2, gases may also be supplied from the gas supply system 39, the gas supply system 40, the gas supply system 44 and the gas supply system 45. In such a case, the valves of these gas supply systems are opened, and the flow rate controllers thereof are controlled to adjust supply rates of the gases.

In the plasma processing method in accordance with the present example embodiment, the processing target substrate W is then taken out of the processing vessel 12 (block S3).

Thereafter, while the processing target substrate is not accommodated in the processing vessel 12, a microwave is generated from the microwave generator 16, and a cleaning gas is supplied into the through hole 20h and the processing space S such that a pressure within the processing space S is set to be a first pressure (block S4). At block S4, by generating oxygen plasma within the through hole 20h, a first cleaning process is performed. Through this first cleaning process, the deposit on the surface of the member facing the through hole 20h is removed.

At block S4, the cleaning gas may contain an oxygen gas supplied into the processing space S from the gas supply system 39 via the pipe 36, the injector 41 and the through hole 20h. At block S4, the microwave generator 16 is set to be in an operation mode to generate the microwave. Further, the valve 39b of the gas supply system 39 is opened, and the flow rate controller 39c is controlled to adjust a supply rate of the oxygen gas.

In the present example embodiment, at block S4, an argon gas as well as the cleaning gas may also be supplied from the gas supply system 40. In order to supply the argon gas from the gas supply system 40, the valve 40b of the gas supply system 40 is opened, and the flow rate controller 40c is controlled to adjust a supply rate of the argon gas. In this way, by supplying the argon gas together with the cleaning gas, it is possible to generate plasma efficiently.

Further, in the present example embodiment, the cleaning gas used at block S4 may also contain an oxygen gas supplied from the gas supply system 44. In order to supply the oxygen gas from the gas supply system 44, the valve 44b of the gas supply system 44 is opened and the flow rate controller 44c is controlled to adjust a supply rate of the oxygen gas. Further, at block S4, an argon gas may also be supplied from the gas supply system 45. In order to supply the argon gas from the gas supply system 45, the valve 45b of the gas supply system 45 is opened and the flow rate controller 45c is controlled to adjust a supply rate of the argon gas. The gases supplied from the gas supply system 44 and/or the gas supply system 45 via the gas supply unit 42 may consume the microwave energy which is supplied into the processing space S without being consumed within the through hole 20h. Accordingly, it may be possible to suppress the wall surface of the processing vessel 12 forming the processing space S or members provided within the processing space S from being damaged by the microwave energy which is not consumed within the through hole 20h.

At block S4, a flow rate ratio between the argon gas and the oxygen gas may be set such that a flow rate of the argon gas is equal to or less than about 1.1 with respect to a flow rate of the oxygen gas of about 1.0. With this flow rate ratio, it may be possible to achieve both plasma generation efficiency and cleaning efficiency.

At block S4, the pressure of the processing space S is controlled to be the first pressure by adjusting the supply rates of the gases used at block S4 through the flow rate controllers and, also, by adjusting an exhaust rate of the gas exhaust device 56. This first pressure is lower than a second pressure to be described blow. For example, the first pressure may be equal or less than about 10 mTorr (about 1.3333 Pa).

In case that the pressure of the processing space S is set to be the second pressure, a molecular density of the cleaning gas within the processing space S is relatively high, and the microwave energy supplied from the antenna 18 is mainly consumed by cleaning gas molecules that exist within the processing space S. Meanwhile, if the pressure of the processing space S is set to be the first pressure, the molecular density of the cleaning gas within the through hole 20h becomes relatively higher than that in case when the pressure of the processing space S is set to be the second pressure. This increase of the molecular density of the cleaning gas within the through hole 20h may be caused by the shape of the through hole 20h, i.e., the shape in which a conductance is reduced at a portion of the through hole 20h to allow the gas to stay within the through hole 20h. Since the molecular density of the cleaning gas is increased within the through hole 20h, the microwave energy supplied from the antenna 18 is consumed by the cleaning gas molecules that exist within the through hole 200h. Accordingly, oxygen plasma is generated within the through hole 20h, so that a deposit on the surface of the member facing the through hole 20h is removed.

Then, in the plasma processing method in accordance with the present example embodiment, while loading no processing target substrate into the processing vessel 12, a microwave is generated from the microwave generator 16, and the cleaning gas is supplied such that the pressure of the processing space S is set to be the second pressure higher than the first pressure (block S5). At block S5, an argon gas may also be supplied, as the same manner at block S4. At block S5, the microwave generator 16 is also set to be in an operation mode to generate the microwave. Further, the cleaning gas and/or the argon gas may be supplied from the gas supply systems used at block S4. Through block S5, a second cleaning process is performed, and the deposit on wall surfaces forming the processing space S may be removed.

In the plasma processing method in accordance with the present example embodiment, the process of block S5 is performed after the process of block S4. That is, the process of block S4 is performed before the process of block S5. Accordingly, after a reaction product between the deposit formed on the surface of the member facing the through hole 20h and the cleaning gas is discharged out into the processing space S, the processing space S is cleaned. Thus, it may be possible to further reduce deposits within the plasma processing apparatus 10.

Figure 5:
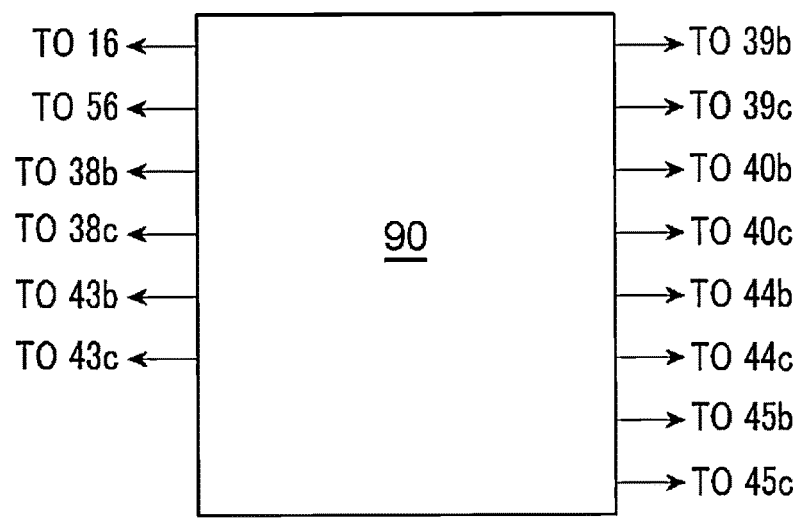
FIG. 5 is a diagram illustrating a controller that can be provided in the plasma processing apparatus in accordance with the example embodiment.

In the present example embodiment, the plasma processing apparatus 10 may further include a controller configured to control respective components of the apparatus at blocks S2, S4 and S5 of the plasma processing method. FIG. 5 illustrates an example controller that is provided in the plasma processing apparatus according to the example embodiment. The plasma processing apparatus 10 may further include a controller 90 shown in FIG. 5.

The controller 90 may be implemented by, but not limited to, a computer having a central processing unit (CPU) and a storage unit such as a memory. The controller 90 may output various control signals according to programs stored in the storage unit. The various control signals from the controller 90 are applied to the microwave generator 16, the gas exhaust device 56, the valve 38b, the flow rate controller 38c, the valve 43b, the flow rate controller 43c, the valve 39b, the flow rate controller 39c, the valve 40b, the flow rate controller 40c, the valve 44b, the flow rate controller 44c, the valve 45b, and the flow rate controller 45c.

To be more specific, in order to perform the process of block S2, the controller 90 outputs a control signal for setting the microwave generator 16 to be an operation mode to the microwave generator 16. Further, the controller 90 also outputs control signals to the valves 38b and 43b to open the valves 38b and 43b. Further, the controller 90 outputs a control signal to the flow rate controller 38c to adjust a flow rate of the gas from the gas source 38a to be a preset flow rate, and also outputs a control signal to the flow rate controller 43c to adjust a flow rate of the gas from the gas source 43a to be a certain flow rate. Furthermore, the controller 90 outputs a control signal for adjusting an exhaust rate of the gas exhaust device 56 to the gas exhaust device 56.

In the present example embodiment, at block S2, the gases may be supplied from the gas supply systems 39, 40, 44 and 45 as well. In such a case, the controller 90 may output control signals to the respective valves and flow rate controllers of these gas supply systems.

Further, in order to perform the process of block S4, the controller 90 is operated in a first mode. In the first mode, the controller 90 outputs a control signal for setting the microwave generator 16 to be an operation mode to the microwave generator 16. Further, the controller 90 outputs control signals to the valve 39b, the flow rate controller 39c, the valve 40b, the flow rate controller 40c, the valve 44b, the flow rate controller 44c, the valve 45b and the flow rate controller 45c, respectively. Further, the controller 90 also outputs a control signal for adjusting an exhaust rate of the gas exhaust device 56 to the gas exhaust device 56, so that the pressure of the processing space S is set to be the first pressure. As a result, the process of block S4 is performed.

Further, in order to perform the process of block S5, the controller 90 is operated in a second mode. In the second mode, the controller 90 outputs a control signal for setting the microwave generator 16 to be an operation mode to the microwave generator 16. Further, the controller 90 outputs control signals to the valve 39b, the flow rate controller 39c, the valve 40b, the flow rate controller 40c, the valve 44b the flow rate controller 44c, the valve 45b and the flow rate controller 45c, respectively. Further, the controller 90 also outputs a control signal for adjusting an exhaust rate of the gas exhaust device 56 to the gas exhaust device 56, so that the pressure of the processing space S is set to be the second pressure. As a result, the process of block S5 is performed.

As stated above, by using the plasma processing apparatus 10 having the controller 90, it is possible to automatically control the respective components of the plasma processing apparatus 10 configured to perform the processes of blocks S2, S4 and S5 of the plasma processing method as described in FIG. 4.

Now, an experimental example of the above-discussed plasma processing method will be explained. In this experimental example, the above-described processes of blocks S1 to S5 are performed in sequence. Processing conditions for the respective processes in this experimental example are as specified below. Further, as a comparative example, processes of blocks S1, S2, S3 and S5 are performed in sequence. Processing conditions for the respective processes in this comparative example are set to be the same as those of the corresponding processes of the experimental example.

(Block S2)
Microwave power: about 2000 W
Microwave frequency: about 2.45 GHz
RF power outputted from high frequency power supply 58: about 120 W
Flow rate of argon gas: about 1000 sccm
Flow rate of $CH_2F_2$ gas: about 5 sccm
Flow rate of oxygen gas ($O_2$ gas): about 2 sccm
Flow rate ratio (flow rate at central gas inlet unit:flow rate at peripheral gas inlet unit): about 30:about 70
Pressure of processing spare S: about 20 mTorr (about 2.6666 Pa)
Processing time: about 60 seconds
Temperature of processing space S:
upper region: about 80° C., inner surface of sidewall 12a: about 80° C.
Temperature of stage 14:
center: about 30° C., periphery: about 30° C.
Coolant temperature of stage 14: about 10° C.
(Block S4)
Microwave power: about 3000 W
Microwave frequency: about 2.45 GHz
RF power outputted from high frequency power supply 58: about 0 W
Flow rate of argon gas: about 110 sccm
Flow rate of oxygen gas ($O_2$ gas): about 100 sccm
Flow rate ratio (flow rate at central gas inlet unit:flow rate at peripheral gas inlet unit): about 30:about 70
Pressure of processing space S: about 5 mTorr (about 0.6666 Pa)
Processing time: about 90 seconds
Temperature of processing space S:
upper region: about 80° C., inner surface of sidewall 12a: about 80° C.
Temperature of stage 14:
center: about 30° C., periphery, about 30° C.
Coolant temperature of stage 14: about 10° C.
(Block S5)
Microwave power: about 3000 W
Microwave frequency: about 2.45 GHz
RF power outputted from high frequency power supply 58: about 0 W
Flow rate of argon gas: about 100 sccm
Flow rate of oxygen gas ($O_2$ gas): about 100 sccm
Flow rate ratio (flow rate at central gas inlet unit:flow rate at peripheral gas inlet unit): about 5:about 95
Pressure of processing space S: about 20 mTorr (about 2.6666 Pa)
Processing time: about 90 seconds
Temperature of processing space S:
upper region: about 80° C., inner surface of sidewall 12a: about 80° C.
Temperature of stage 14:
center: about 30° C., periphery: about 30° C.
Coolant temperature of stage 14: about 10° C.

Figure 6A:
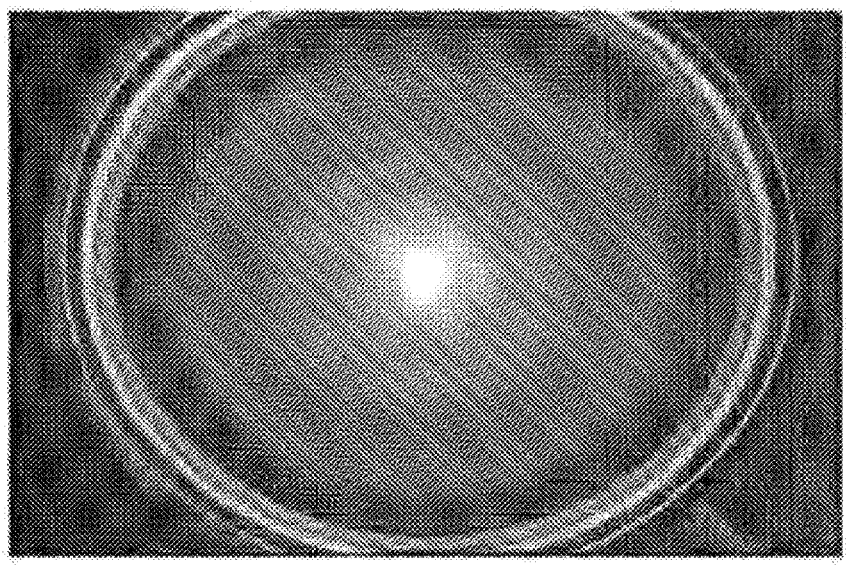
FIG. 6A and FIG. 6B provide images showing plasma emission states in an experimental example and a comparative example, respectively.
Figure 6B:
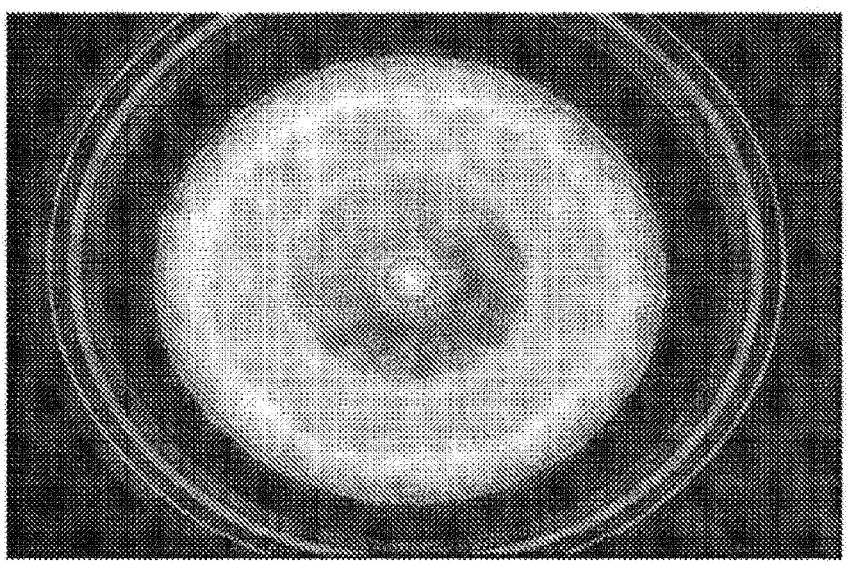

FIG. 6A and FIG. 6B depict images showing plasma emission states in the experimental example and the comparative example, respectively. FIG. 6A shows an image of a plasma emission state directly under the dielectric window 20 under the same processing conditions as at block S4 according to the experimental example. The image is seen from the side of the processing space S. FIG. 6B shows an image of a plasma emission state directly under the dielectric window 20 under the same processing conditions as at block S5 according to the comparative example. The image is seen from the side of the processing space S. As can be seen from the luminance at a central portion of the image of FIG. 6A, plasma is generated within the through hole 20h by setting the pressure of the processing space S to be the first pressure. Meanwhile, as can be seen from FIG. 6B, when the pressure of the processing space S is set to be the second pressure, plasma is generated directly under the dielectric window 20, but the plasma is not sufficiently generated within the through hole 20h.

Figure 7A:
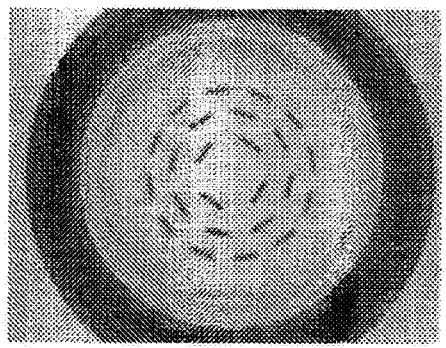
FIG. 7A and FIG. 7D provide images showing cleaning results in the experimental example and the comparative example, respectively.
Figure 7B:
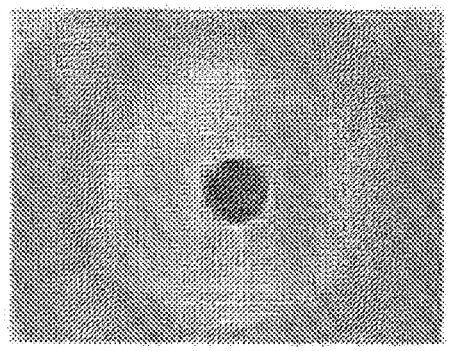
Figure 7C:
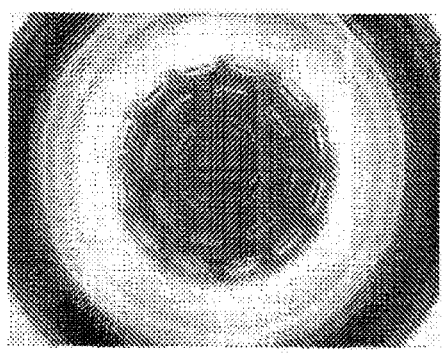
Figure 7D:
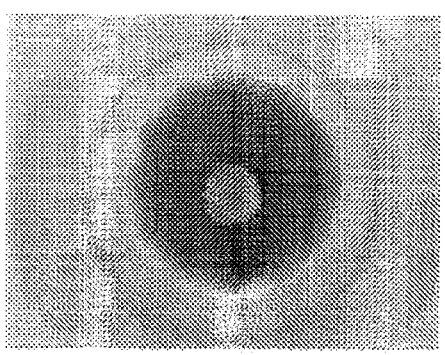

FIG. 7A to FIG. 7D provide images showing cleaning results in the experimental example and the comparative example, respectively. FIG. 7A shows an image of the second surface 41b of the injector 41, seen from the through hole 20h after performing the experimental example. FIG. 7B shows an image of the through hole 20h, seen from the upper side (injector 41) after performing the experimental example. FIG. 7C shows an image of the second surface 41b of the injector 41, seen from the through hole 20h after performing the comparative example. FIG. 7D shows an image of the through hole 20h, seen from the upper side (injector 41) after performing the comparative example. As can be seen from FIG. 7C and FIG. 7D, in case of performing the cleaning process only through the process of block S5 without performing the process of block S4, it is found that deposits remain on the wall surfaces forming the through hole 20h and on the surface of the injector 41. Meanwhile, as depicted in FIG. 7A and FIG. 7B, after performing the experimental example, it is found that deposits are removed from the wall surfaces forming the through hole 20h and the surface of the injector 41.

From the foregoing, it will be appreciated that various embodiments of the present disclosure have been described herein for purposes of illustration and are not intended to be limiting, and that various modifications may be made. By way of example, in the above-described example embodiment, the etching gas is described as an example of the processing gas. However, instead of the etching gas, a film forming gas in a chemical vapor deposition method may be used as the processing gas.

Further, in the above-described example embodiment, the same kind of gases are supplied into the through hole 20h and the gas supply unit 42 from the individual gas supply systems. However, the gas may be supplied into the through hole 20h and the gas supply unit 42 from a single gas supply system. In such a configuration, a supply rate of the gas supplied into the through hole 20h and the gas supply unit 42 from the single gas supply system may be controlled by a member such as a flow splitter or the like.

Moreover, in the above-described example embodiment, the process of block S5 is performed after the process of block S4. However, it may be also possible to perform the process of block S4 after the process of block S5. In such a case, the controller 90 may be turned into the first mode after being operated in the second mode.

In addition, in the above-described example embodiment, the processes of block S4 and block S5 are performed for the process (block S2) of every single processing target substrate W. However, the processes of block 4 and block 5 may be performed after processing a multiple number of processing target substrates. That is, the number of performing the process of block S4 and/or block S5 with respect to the number of performing the process of block S2 may be set as required.

EXPLANATION OF CODES

10: Plasma processing apparatus
12: Processing vessel
14: Stage
16: Microwave generator
18: Antenna
20: Dielectric window
20h: Through hole
22: Tuner
24: Rectangular waveguide
26: Mode converter
28: Coaxial waveguide
30: Slot plate
32: Dielectric plate
34: Cooing jacket
36: Pipe
38: Gas supply system
39: Gas supply system (cleaning gas supply system)
40: Gas supply system (cleaning gas supply system)
41: Injector
42: Gas supply unit
43: Gas supply system
44: Gas supply system (another cleaning gas supply system)
45: Gas supply system (another cleaning gas supply system)
90: Controller
S: Processing space
W: Processing target substrate

We claim:

1. A plasma processing method performed in a plasma processing apparatus,
wherein the plasma processing apparatus comprises:
a processing vessel having a processing space formed therein;
a microwave generator;
an antenna, configured to radiate a microwave for plasma excitation based on a microwave generated by the microwave generator, including a slot plate having multiple slots arranged in a circumferential direction thereof with respect to an axis line;
a dielectric window, provided between the processing space and the antenna, having a through hole through which a gas is supplied into the processing space; and
a cleaning gas supply system configured to supply a cleaning gas containing an oxygen gas into the through hole,
wherein an opening of the through hole at a side of the processing space is positioned on the same plane with a bottom surface of the dielectric window, and
wherein the plasma processing method comprises:
performing a process on a processing target substrate accommodated in the processing vessel and then taking the processing target substrate out of the processing vessel;
while the processing target substrate is not accommodated in the processing vessel, radiating the microwave from the antenna and supplying the cleaning gas into the through hole and the processing space such that a pressure of the processing space is set to be a first pressure;
performing a first cleaning process at the first pressure of the processing space such that a plasma of the oxygen gas is generated within the through hole; and
performing a second cleaning process at a second pressure of the processing space which is set to be higher than the first pressure of the processing space such that the plasma of the oxygen gas is suppressed from being generated within the through hole,
wherein the through hole includes: an upper portion having a tapered shape such that a diameter thereof decreases downward along the axis line; and a lower portion having a cylindrical shape such that a diameter thereof is constant along the axis line, in the performing of the first cleaning process and in the performing of the second cleaning process, an argon gas is additionally supplied into the through hole, the first cleaning process and the second cleaning process are performed for the process of each processing target substrate, in the performing of the first cleaning process, the oxygen gas is supplied into the processing space at a first flow rate and the argon gas is supplied into the processing space at a second flow rate, in the performing of the second cleaning process, a flow rate of the oxygen gas is maintained while a flow rate of the argon gas is set to be higher than the second flow rate, and in the performing of the second cleaning process, the pressure of the processing space is set to be the second pressure by adjusting an exhaust rate of a gas exhaust device.

2. The plasma processing method of claim 1, wherein the first pressure is equal to or less than about 10 mTorr (about 1.3333 Pa).

3. The plasma processing method of claim 1, wherein the performing of the first cleaning process is carried out before the performing of the second cleaning process.

4. The plasma processing method of claim 1, wherein the plasma processing apparatus further comprises:
a stage provided to face the dielectric window in an extension direction of the axis line;
a gas supply unit configured to supply a gas from surroundings of the axis line into a space between the stage and the dielectric window; and
another cleaning gas supply system configured to supply a cleaning gas containing an oxygen gas into the gas supply unit,
wherein the cleaning gas from the gas supply unit is additionally supplied into the processing space in the performing of the first cleaning process.

5. A plasma processing apparatus, comprising:
a processing vessel having a processing space formed therein;
a microwave generator;
an antenna, configured to radiate a microwave for plasma excitation based on a microwave generated by the microwave generator, including a slot plate having multiple slots arranged in a circumferential direction thereof with respect to an axis line;
a dielectric window, provided between the processing space and the antenna, having a through hole through which a gas is supplied into the processing space;
a cleaning gas supply system configured to supply a cleaning gas containing an oxygen gas into the through hole; and
a controller configured to control the microwave generator and the cleaning gas supply system,
wherein an opening of the through hole at a side of the processing space is positioned on the same plane with a bottom surface of the dielectric window,
a process on a processing target substrate accommodated in the processing vessel is performed and then the processing target substrate is taken out of the processing vessel, while the processing target substrate is not accommodated in the processing vessel, the controller is configured to output, to the microwave generator, a first control signal for radiating the microwave from the antenna and is configured to output, to the cleaning gas supply system, a second control signal for supplying the cleaning gas into the through hole and the processing space such that a pressure of the processing space is set to be a first pressure;

the controller is configured to operate in a first mode to supply the cleaning gas from the cleaning gas supply system at the first pressure of the processing space such that a plasma of the oxygen gas is generated within the through hole, and the controller is configured to operate in a second mode to supply the cleaning gas from the cleaning gas supply system at a second pressure of the processing space which is set to be higher than the first pressure of the processing space such that the plasma of the oxygen gas is suppressed from being generated within the through hole, wherein the through hole includes: an upper portion having a tapered shape such that a diameter thereof decreases downward along the axis line; and a lower portion having a cylindrical shape such that a diameter thereof is constant along the axis line, in the first mode and in the second mode, an argon gas is additionally supplied into the through hole, the first mode and the second mode are operated for the process of each processing target substrate, in the first mode, the oxygen gas is supplied into the processing space at a first flow rate and the argon gas is supplied into the processing space at a second flow rate, in the second mode, a flow rate of the oxygen gas is maintained while a flow rate of the argon gas is set to be higher than the second flow rate, in the second mode, the pressure of the processing space is set to be the second pressure by adjusting an exhaust rate of a gas exhaust device.

6. The plasma processing apparatus of claim 5, wherein the first pressure is equal to or less than about 10 mTorr (about 1.3333 Pa).

7. The plasma processing apparatus of claim 5, wherein the controller is further configured to operate in the second mode after operated in the first mode.

8. The plasma processing apparatus of claim 5, further comprising:
a stage provided to face the dielectric window in an extension direction of the axis line;
a gas supply unit configured to supply a gas from the surroundings of the axis line into a space between the stage and the dielectric window; and
another cleaning gas supply system configured to supply a cleaning gas containing an oxygen gas into the gas supply unit,
wherein the controller is configured to supply, in the first mode, the cleaning gas from the another gas supply system.

* * * * *